(12) United States Patent
Khalili et al.

(10) Patent No.: US 12,375,041 B2
(45) Date of Patent: Jul. 29, 2025

(54) DISTRIBUTED ACTIVE POWER COMBINING AMPLIFIER

(71) Applicant: QUALCOMM INCORPORATED, San Diego, CA (US)

(72) Inventors: Alireza Khalili, Campbell, CA (US); Amir Ziabasharhagh, Campbell, CA (US); Beomsup Kim, Los Altos Hills, CA (US)

(73) Assignee: QUALCOMM Incorporated, San Diego, CA (US)

( * ) Notice: Subject to any disclaimer, the term of this patent is extended or adjusted under 35 U.S.C. 154(b) by 708 days.

(21) Appl. No.: 17/490,683

(22) Filed: Sep. 30, 2021

(65) Prior Publication Data
US 2022/0109405 A1 Apr. 7, 2022

Related U.S. Application Data

(60) Provisional application No. 63/086,800, filed on Oct. 2, 2020.

(51) Int. Cl.
*H03F 1/02* (2006.01)
*H03F 1/56* (2006.01)
(Continued)

(52) U.S. Cl.
CPC ........... *H03F 1/0288* (2013.01); *H03F 1/565* (2013.01); *H03F 3/195* (2013.01); *H03F 3/245* (2013.01);
(Continued)

(58) Field of Classification Search
CPC ........ H03F 1/0288; H03F 1/565; H03F 3/195; H03F 3/245; H03F 2200/451;
(Continued)

(56) References Cited

U.S. PATENT DOCUMENTS

| | | |
|---|---|---|
| 2010/0117737 A1 | 5/2010 | Kondo et al. |
| 2017/0012653 A1 | 1/2017 | Fong et al. |

(Continued)

FOREIGN PATENT DOCUMENTS

WO 2020182305 A1 9/2020

OTHER PUBLICATIONS

International Search Report and Written Opinion—PCT/US2021/053057—ISA/EPO—Jan. 24, 2022.
Taiwan Search Report—TW110136780—TIPO—May 15, 2025.

*Primary Examiner* — Andrea Lindgren Baltzell
*Assistant Examiner* — Khiem D Nguyen
(74) *Attorney, Agent, or Firm* — Smith Tempel Blaha LLC/Qualcomm Incorporated

(57) ABSTRACT

A distributed active, power combining amplifier including at least one main amplifier having a first main portion and a second main portion, at least one peaking amplifier having a first peaking portion and a second peaking portion, and a transformer having a primary side and a secondary side, the primary side having at least a first primary segment, a second primary segment, a third primary segment and a fourth primary segment, wherein the first main portion is coupled to the first primary segment and the second primary segment, the first peaking portion is coupled to the first primary segment or the second primary segment, the second main portion is coupled to the third primary segment and the fourth primary segment, and the second peaking portion is coupled to the third primary segment or the fourth primary segment in a symmetric architecture.

30 Claims, 13 Drawing Sheets

(51) Int. Cl.
  *H03F 3/195*  (2006.01)
  *H03F 3/24*  (2006.01)
(52) U.S. Cl.
  CPC .. *H03F 2200/451* (2013.01); *H03F 2200/537* (2013.01)
(58) Field of Classification Search
  CPC .......... H03F 2200/537; H03F 2200/09; H03F 2200/387; H03F 2200/534; H03F 2200/541; H03F 3/005; H03F 3/211; H03F 3/45475
  USPC .............................. 330/295, 124 R, 195, 276
  See application file for complete search history.

(56) References Cited

U.S. PATENT DOCUMENTS

| | | | |
|---|---|---|---|
| 2020/0259461 A1* | 8/2020 | Bouisse | H03F 3/245 |
| 2022/0006429 A1* | 1/2022 | Bao | H03F 3/245 |

* cited by examiner

DISTRIBUTED ACTIVE POWER COMBINING AMPLIFIER

RELATED APPLICATIONS

This application claims priority to and the benefit of U.S. Provisional Patent Application No. 63/086,800, entitled "DISTRIBUTED ACTIVE POWER COMBINING POWER AMPLIFIER," filed Oct. 2, 2020, the contents of which are hereby incorporated herein by reference in their entirety as if fully set forth below and for all applicable purposes.

FIELD

The present disclosure relates generally to electronics, and more specifically to radio frequency (RF) transmitters and receivers.

BACKGROUND

Wireless communication devices and technologies are becoming ever more prevalent, as are communication devices that operate at various frequencies. Wireless communication devices generally transmit and receive communication signals.

A transmitter in a communication system generally uses one or more amplifier stages and one or more mixers to upconvert a signal for transmission. For example, in the upconversion path, a baseband (or near baseband) signal or an intermediate frequency (IF) signal may be upconverted by a mixer to a radio frequency (RF) signal for transmission and in the downconversion path, a radio frequency (RF) signal may be downconverted by a mixer to an intermediate frequency (IF) signal, or to a baseband (or near baseband) signal for reception.

In a transmitter, it is desirable that the power amplifier provide the desired output power level, provide efficiency at both full power and at backoff power levels, and also limit signal distortion and signal harmonics.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a distributed active, power combining amplifier including at least one main amplifier having a first main portion and a second main portion, at least one peaking amplifier having a first peaking portion and a second peaking portion, and a transformer having a primary side and a secondary side, the primary side having at least a first primary segment, a second primary segment, a third primary segment and a fourth primary segment, wherein the first main portion is coupled to the first primary segment and the second primary segment, the first peaking portion is coupled to the first primary segment or the second primary segment, the second main portion is coupled to the third primary segment and the fourth primary segment, and the second peaking portion is coupled to the third primary segment or the fourth primary segment in a symmetric architecture.

Another aspect of the disclosure provides a method for operating an amplifier comprising a transformer including amplifying a communication signal to generate a maximum power, increasing an impedance at a primary side of the transformer at a reduced power, and amplifying the communication signal to generate the reduced power while maintaining a power efficiency within a range of 3 dB.

Another aspect of the disclosure provides an amplifier including a transformer, means for amplifying a communication signal to generate a maximum power, means for causing an impedance increase at a primary side of the transformer at a reduced power, and means for amplifying the communication signal to generate the reduced power while maintaining a power efficiency within a range of 3 dB.

Another aspect of the disclosure provides an amplifier including a plurality of main amplifier portions, a plurality of peaking amplifier portions, a transformer having a primary side and a secondary side, the primary side having a plurality of primary segments, and a plurality of loops, each loop formed by a respective main amplifier portion of the plurality of main amplifier portions, one or more respective peaking amplifier portions of the plurality of peaking amplifier portions, and a two or more respective segments of the plurality of primary segments.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
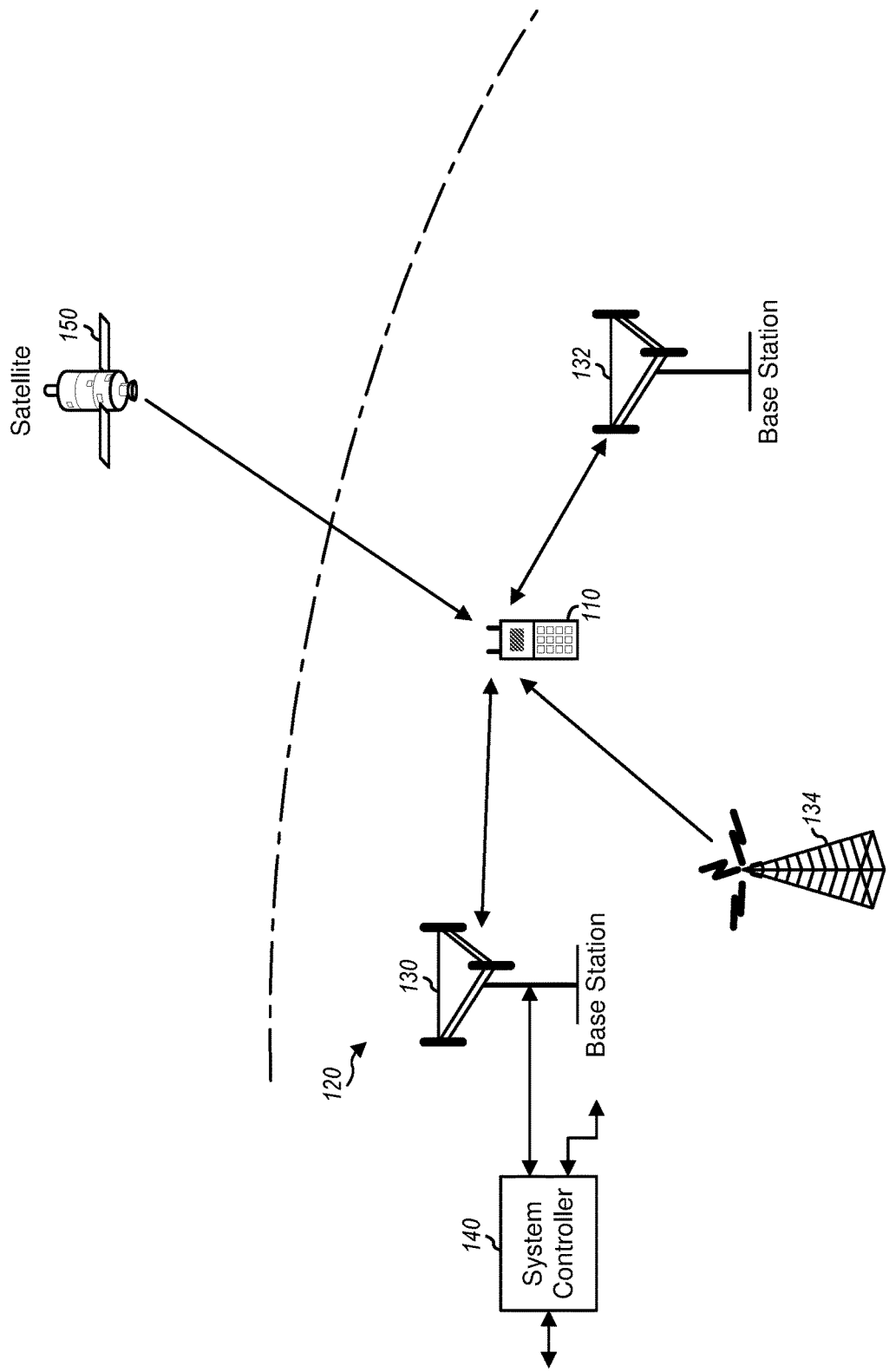
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

A modern wireless communication device that operates at various frequencies in various communication bands should meet a number of radio frequency (RF) power transmission, efficiency, and energy emission standards.

Some communication systems and devices use a type of transmit and receive architecture referred to as heterodyne, or super-heterodyne. A super-heterodyne architecture uses an intermediate frequency, that is, a transmit signal is upconverted first from a baseband (or near baseband) signal to an intermediate frequency (IF), and is then upconverted from the IF to a radio frequency (RF) signal using a local oscillator (LO) frequency signal for IF signal upconversion and transmission. Similarly, a receive signal is downconverted first from an RF frequency to an IF frequency, and then downconverted from the IF to a baseband (or near baseband) signal for information recovery. Other communication systems employ a direct conversion architecture that does not use an intermediate frequency signal.

When a power amplifier is fed with a multi-tone signal at its input, it amplifies the signal and also generates unwanted intermodulation (IM) products. When the amplifier is operating in the linear region, the intermodulation products are generated at various frequency multiples of the input signals which do not interfere with the main signals. However, as the power amplifier approaches the saturation point (Psat or Pmax) and enters the non-linear region of operation, the interference increases. Because the amplifier is operating in the non-linear region, the interference products can start to interfere with the main signals and thus lower the quality/linearity of the output signal.

In applications where it is desirable that the amplifier operate only in the linear region, the amplifier should be operated at a power level that is lower than the saturated level. This is done to ensure that even if the input power increases slightly the amplifier remains in the linear region and does not enter the non-linear region of operation.

The power backoff in an amplifier is a power level below the saturation point at which the amplifier will continue to operate in the linear region even if there is a slight increase in the input power level. Usually, power amplifier efficiency is maximum when it operates close to the saturation point (Psat). However, at the Psat point, a small increase in input power can cause the amplifier to move from the linear region to the saturated region. Thus, to ensure that the power amplifier operates in the linear region the power level is lowered from the point of maximum efficiency to ensure that it operates in the linear region if there is a slight increase in power. The amount by which the power level is lowered is called power backoff. As the power output of the power amplifier is lowered from Psat, the efficiency of the power amplifier drops. Therefore, it is desirable to limit the decrease in efficiency of the power amplifier when it is operating at power backoff.

One type of an efficient amplifier architecture is a Doherty amplifier. A Doherty amplifier is generally used where high efficiency is desired. Like most amplifiers, a Doherty amplifier has its maximum efficiency when it is operating at maximum power, also referred to as saturated power, or Psat. However, to accommodate input signal peaks that may cause an amplifier to exceed the linear region and enter a non-linear mode of operation, a Doherty power amplifier is typically operated at a power level that is less than its maximum power, what is typically referred to as a backoff power level, or backoff power.

In an exemplary embodiment, the distributed active, power combining power amplifier described herein provides increased efficiency, and maintains its efficiency at power backoff.

In an exemplary embodiment, the distributed active, power combining power amplifier described herein also limits distortion and harmonics.

Exemplary embodiments of a distributed active, power combining power amplifier described herein can be used to amplify a communication signal and maintain high efficiency.

Exemplary embodiments of a distributed active, power combining power amplifier described herein can be implemented using a voltage mode Doherty amplifier architecture.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE or 5G standards.

In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
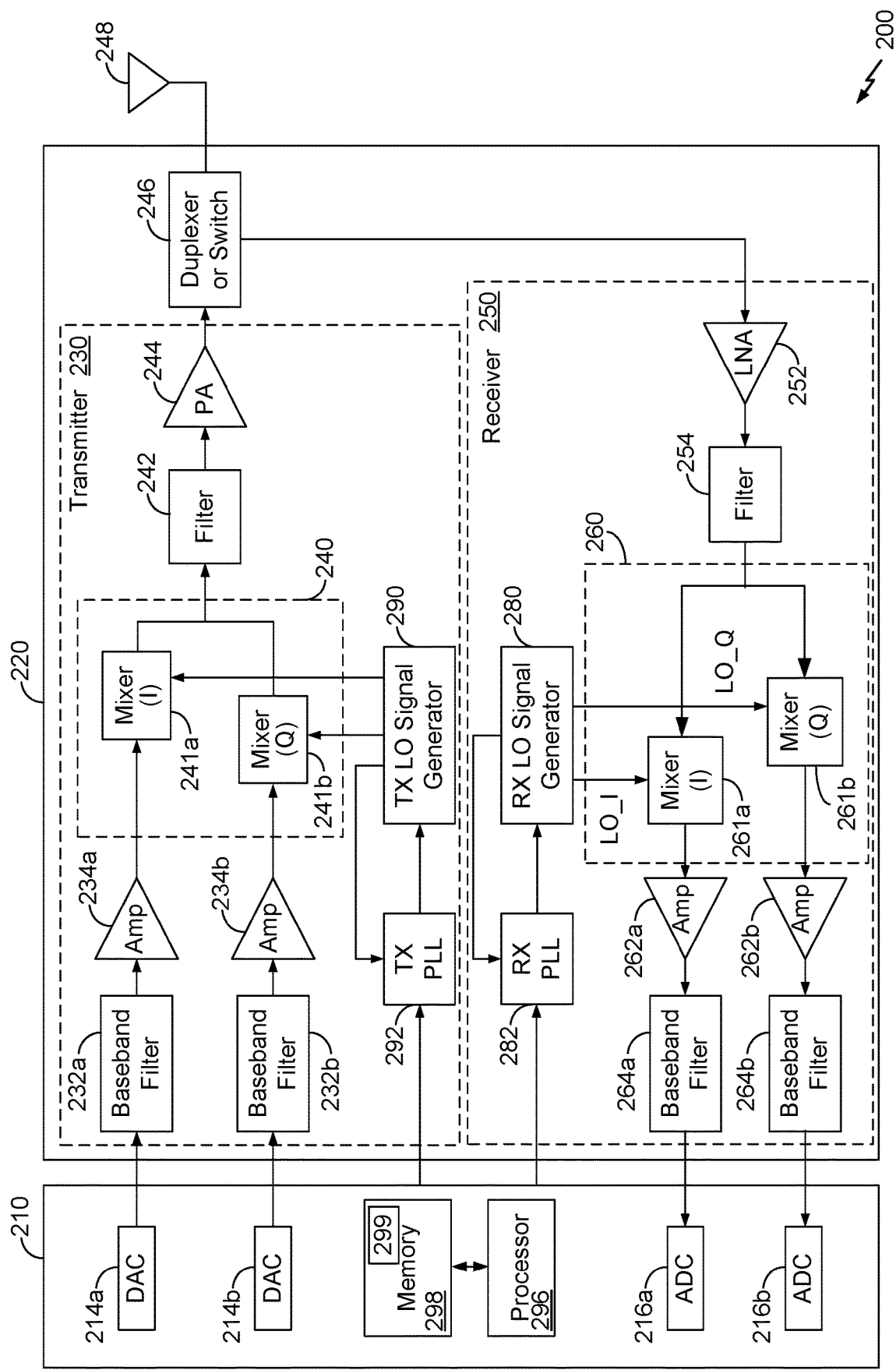
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, as exemplary software 299, and may generally comprise analog and/or digital processing elements. The processor 296 and the memory 298 may cooperate to control, configure, program, or otherwise fully or partially control the operation of the embodiments of the distributed active, power combining power amplifier described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. Sometimes the duplexer or switch 246 may include other active or passive elements and may be referred to as a front-end module (FEM). While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Down-conversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, good efficiency, or a combination of good linearity and efficiency. Other output stages may be implemented in the power amplifier 244 instead of or in addition to the stages recited above.

Exemplary embodiments of a distributed active, power combining power amplifier described herein may be implemented in one or more locations within the filter 242, within the power amplifier 244, within the duplexer or switch 246, or elsewhere. In some embodiments, the distributed active, power combining power amplifier described herein may be implemented on the same IC and/or within the same module as the filter 242, the power amplifier 244 or the duplexer or switch 246. In some embodiments the power amplifier 244 and the filter 242 may be implemented together in a single module. In other embodiments, one or more of these elements may be implemented separate from a module or IC in which another of the elements is implemented. While an architecture in which analog signals are processed by the power amplifier 244 (and by all other elements illustrated in FIG. 2 outside of the data processor 210) is described above, architectures in which an amplifier (for example, a power amplifier) of the transceiver 220 is configured as a digital amplifier or configured otherwise to amplify digital signals may be implemented.

Figure 3:
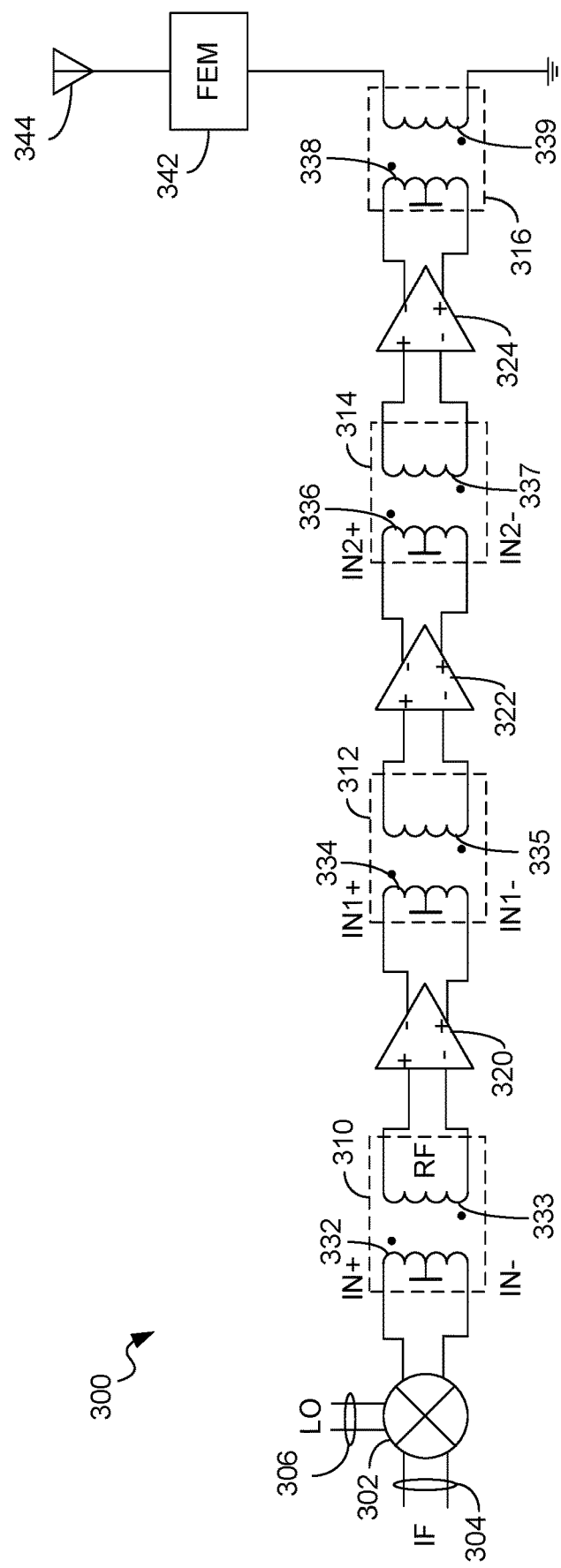
FIG. 3 is a block diagram of at least a portion of an exemplary transmit chain in which exemplary embodiments of the distributed active, power combining power amplifier may be implemented.

FIG. 3 is a block diagram of at least a portion of an exemplary transmit chain 300 in which exemplary embodiments of the distributed active, power combining power amplifier may be implemented. In an exemplary embodiment, the transmit chain 300 may be implemented in a millimeter wave (mmW) or non-mmW communication device that implements a super-heterodyne (superhet) architecture in which a communication signal that is to be transmitted may be converted from a baseband (or near baseband) information signal, to an intermediate frequency signal, and then upconverted from the intermediate frequency to a radio frequency signal. Similarly, a received communication signal may be downconverted from an RF signal, to an IF signal, and then further downconverted from the IF signal to a baseband (or near baseband) information signal. In an exemplary embodiment, the transmit chain 300 may also be implemented in a communication device that implements a direct conversion architecture. The exemplary transmit chain 300 is shown for illustrative purposes only may comprise a portion of a transmit chain in a communication device, such as wireless device 200 (FIG. 2).

In an exemplary embodiment, the transmit chain 300 may comprise a mixer 302 configured to receive an intermediate frequency (IF) communication signal over differential connections 304, and a local oscillator (LO) signal over differential connections 306. The mixer 302 may be referred to as an upconversion mixer, and may be configured to operate over a range of different frequencies.

In an exemplary embodiment, the transmit chain 300 may comprise one or more amplifier stages, with three exemplary amplifier stages 320, 322 and 324 shown in FIG. 3 for example only. The three amplifier stages 320, 322 and 324 may be configured to provide the same or different levels of signal amplification. In an exemplary embodiment, the first amplifier stage 320 and the second amplifier stage 322 may be referred to as driver stages, and the third amplifier stage 324 may be referred to as a power amplifier. More or fewer amplifier stages may be included in a transmit chain, depending on application.

In an exemplary embodiment, one or more of the amplifier stages 320, 322 and 324 may be implemented as a voltage mode amplifier, and may be implemented as a distributed active, power combining power amplifier in accordance with exemplary embodiments of the disclosure. Some exemplary embodiments of the distributed active, power combining power amplifier described herein may be implemented using a voltage mode Doherty amplifier architecture. In an exemplary embodiment, the amplifier stage 324 may be implemented as a distributed active, power combining power amplifier in accordance with exemplary embodiments of the disclosure.

In an exemplary embodiment, the transmit chain 300 may comprise one or more transformers 310, 312, 314 and 316. The transformers 310, 312, 314 and 316 may be configured to pass a communication signal, such as an RF signal, from amplifier stage to amplifier stage. The transformers 310, 312, 314 and 316 may each comprise a primary side and a secondary side. For example, the transformer 310 may comprise a primary side 332 and a secondary side 333. Similarly, the transformer 312 may comprise a primary side 334 and a secondary side 335; the transformer 314 may comprise a primary side 336 and a secondary side 337; and the transformer 316 may comprise a primary side 338 and a secondary side 339. An output of the third amplifier stage 324 may be provided through the transformer 316 to a radio frequency (RF) front-end module (FEM) 342 and then to an antenna 344 for transmission. In an exemplary embodiment, the RF FEM 342 may comprise a duplexer or switch as shown as element 246 in FIG. 2.

The transformers 310, 312, 314 and 316 may be implemented as double-tuned transformers in which the inductances of the primary side and the secondary side may be tuned/resonated separately with a capacitor (not shown) across each inductance. A double-tuned transformer may typically be used for wideband operation.

While the description of FIG. 3 above includes an example in a mmW communication device, the transmit chain 300 is not limited thereto and examples/embodiments described throughout this application may be used for communications at frequencies having a wavelength which is greater than mmW. For example, the transmit chain 300 may be configured for use with signals having a frequency of approximately 2.4 GHz and/or 5-7 GHz, for example as described in a 3GPP (e.g., LTE, 55G, etc.), IEEE (e.g., 802.11), or other standard. In some embodiments, one or more of the transformers 310-314 and/or one or more of the amplifiers 320, 322 are omitted. Further, it will be understood that the connection 304 need not be configured to receive an IF signal; the connection 304 may, for example, be configured to receive a baseband (or near baseband) signal, for example in a direct conversion architecture.

Figure 4:
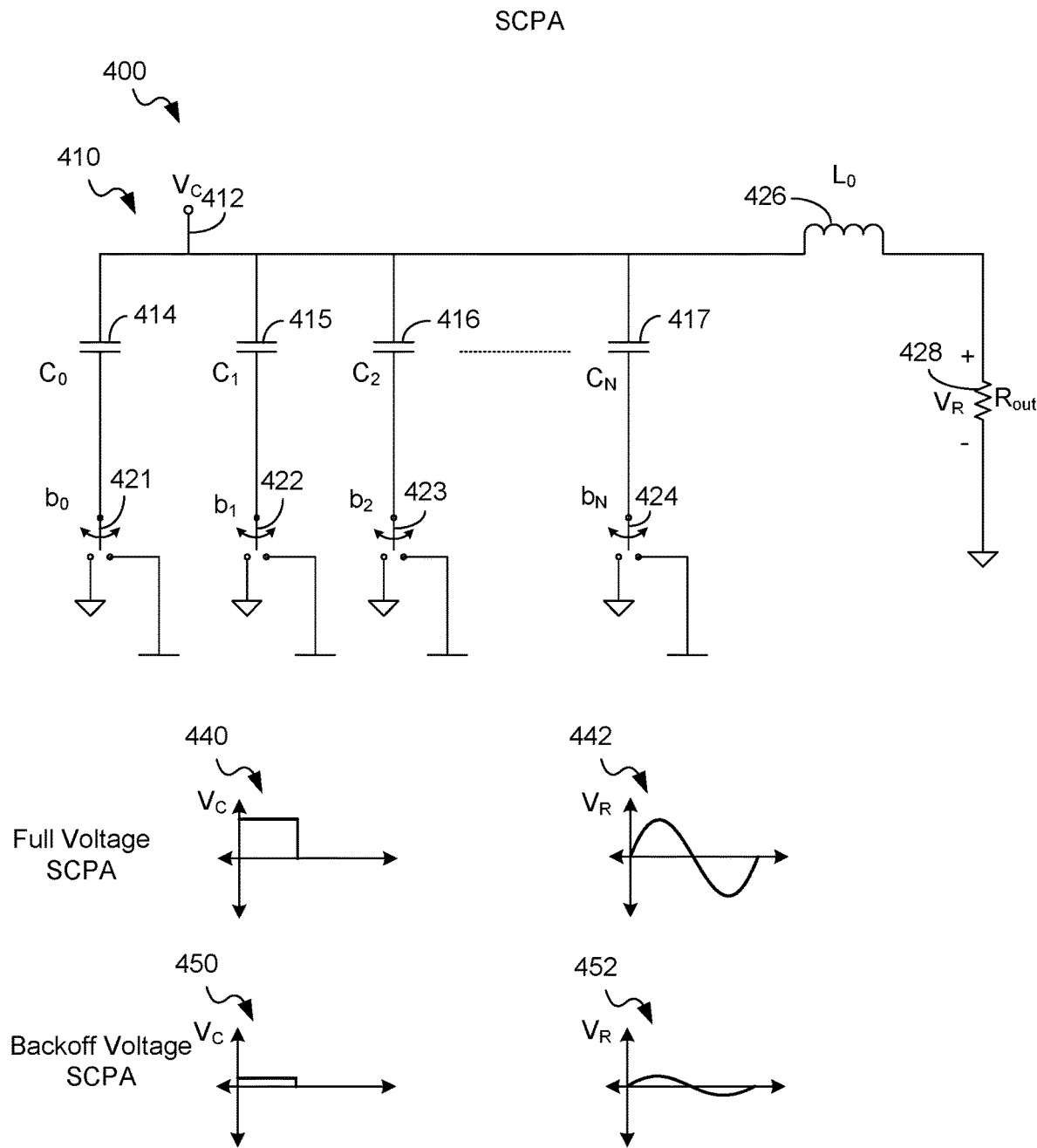
FIG. 4 is a diagram illustrating a simplified switched capacitor power amplifier (SCPA) circuit.

FIG. 4 is a diagram 400 illustrating a simplified switched capacitor power amplifier (SCPA) circuit. In an exemplary embodiment, a switched capacitor power amplifier circuit 410 may comprise a number of capacitances ($C_0$ through $C_N$) 414, 415, 416 and 417; and a number of switches ($b_0$ through $b_N$) 421, 422, 423 and 424. The value of the capacitances ($C_0$ through $C_N$) 414, 415, 416 and 417 may be the same or may be different depending on implementation. The number "N" may be chosen based on amplifier design and desired performance. The switches 421, 422, 423 and 424 may be controlled by a control signal from the data processor 210, such as from the processor 296 and the memory 298, or from another controller.

A system supply voltage, $V_C$, is provided over node 412 to one terminal of the capacitances 414, 415, 416 and 417. An inductance, $L_0$, 426 may have a first terminal coupled to the node 412 and a second terminal coupled to a resistance, $V_R$, 428. The resistance 428 may have another terminal coupled to system ground, and may also be referred to as an output resistance (Rout), or output load.

In an exemplary embodiment, the position of the switches 421, 422, 423 and 424 determines the number of capacitances 414, 415, 416 and 417 that are coupled to the inductance 426, and in turn, determines the power output of the switched capacitor power amplifier circuit 410 across the resistance 428.

In an exemplary embodiment, when the input voltage, $V_C$, is relatively high, such as shown using the graph 440, then the output of the switched capacitor power amplifier circuit 410 is also proportionately high, as shown using the graph 442. Similarly, in an exemplary embodiment, when the input voltage, $V_C$, is relatively low, such as shown using the graph 450, then the output of the switched capacitor power amplifier circuit 410 is also proportionately low, as shown using the graph 452. The graphs 440 and 442 correspond to a switched capacitor power amplifier circuit 410 that may be considered to be a "full voltage" switched capacitor power amplifier circuit 410, and the graphs 450 and 452 correspond to a switched capacitor power amplifier circuit 410 that may be considered to be a "backoff voltage" switched capacitor power amplifier circuit 410.

Figure 5:
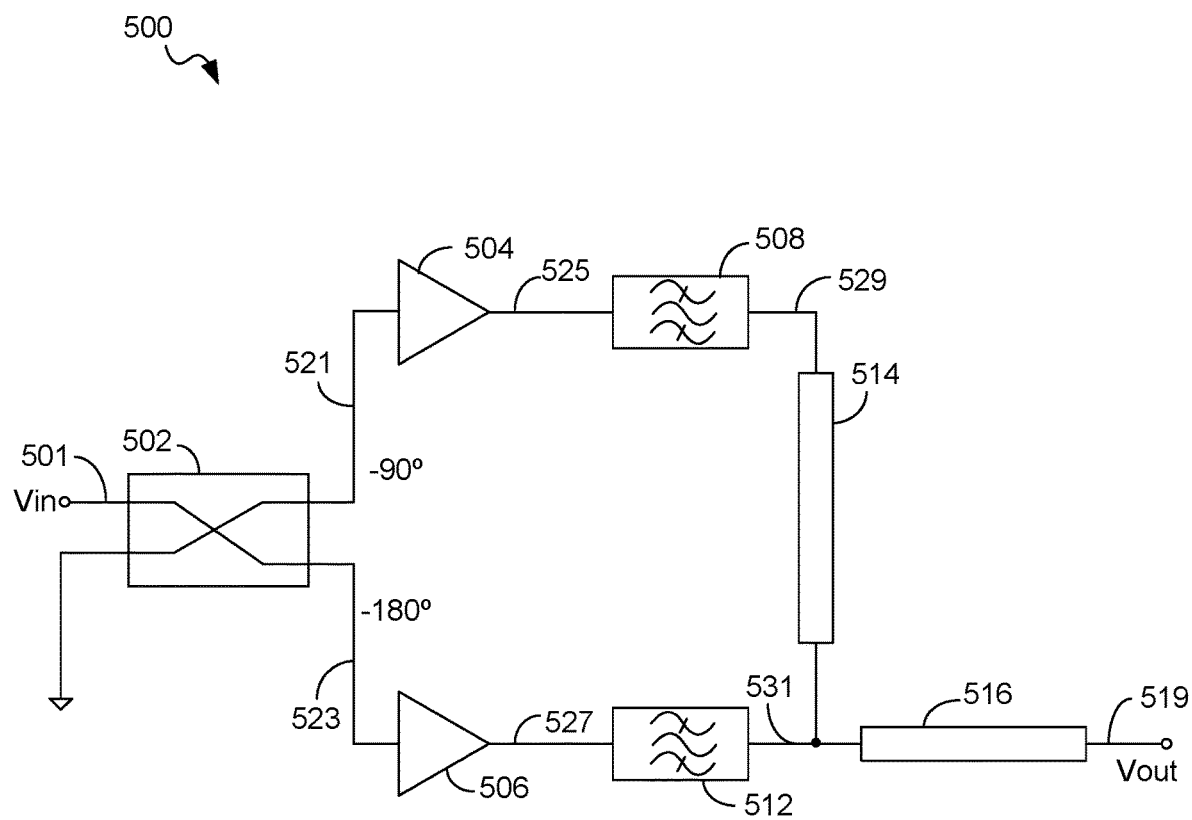
FIG. 5 is a diagram showing an exemplary embodiment of a simplified Doherty amplifier.

FIG. 5 is a diagram showing an exemplary embodiment of a simplified Doherty amplifier 500. The simplified Doherty amplifier 500 includes an input splitter 502 (also referred to as a quadrature generator), a main amplifier 504 (also referred to as carrier amplifier), a peaking amplifier 506, a bandpass filter 508, a bandpass filter 512, a ¼ wave impedance inverter 514, and a ¼ wave impedance transformer 516.

An input signal, Vin, is provided over node 501 to the splitter 502. The splitter 502 splits the power of the input signal, Vin, and generates two out of phase signals that may be out of phase by, for example, 90 degrees. For example, the signal on connection 521 may be at a phase of −90 degrees and the signal on connection 523 may be at a phase of −180 degrees. Other phases are possible with −90 degrees and −180 degrees being shown for example only.

The main amplifier 504 may be configured to operate as a class AB amplifier, and the peaking amplifier 506 may be configured to operate as a class C amplifier. The output of the main amplifier 504 may be provided over connection 525 to the bandpass filter 508 and the output of the peaking amplifier 506 may be provided over connection 527 to the bandpass filter 512. The main amplifier 504 and the peaking amplifier 506 may have an architecture that uses the switched capacitor power amplifier arrangement of FIG. 4, or may have another voltage mode architecture.

The ¼ wave impedance inverter 514 aligns the phases of the respective outputs of the bandpass filter 508 and the bandpass filter 512 and provides a phase-aligned signal on connection 531. The ¼ wave impedance transformer 516 matches the impedance of the signal on connection 531 to the load (not shown) that may be coupled to the output node 519.

Figure 6:
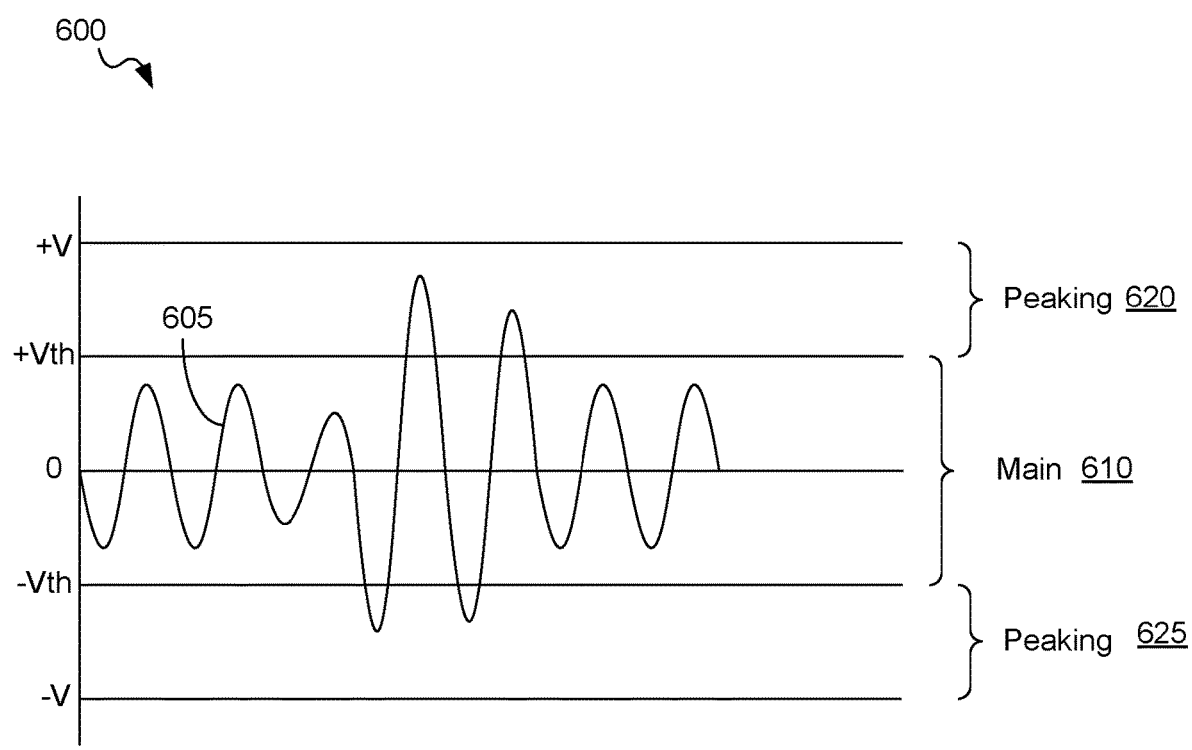
FIG. 6 is a graph showing an example of the operation of the simplified Doherty amplifier of FIG. 5.

FIG. 6 is a graph 600 showing an example of the operation of the simplified Doherty amplifier of FIG. 5. The concepts illustrated in FIG. 6 may also be indicative of the operation of other voltage mode architectures, for example architectures which utilize a main amplifier and a peaking amplifier in a configuration which differs from a Doherty amplifier. A continuous time varying signal 605 may have time varying signal energy (for example, a voltage that may vary from −V to +V). When the time varying signal 605 stays within the region 610, then the time varying signal 605 is amplified only by the main amplifier 504 of FIG. 5. However, when the time varying signal 605 exceeds the region 610 and enters either the region 620 or the region 625, then the peaking amplifier 506 is activated and is used to amplify the signal 605. The control of the main amplifier 504 and the peaking amplifier 506 may be accomplished using a variety of techniques, including for example, the manner in which the main amplifier 504 and the peaking amplifier 506 are biased. In this manner, when the signal energy is relatively low, only the main amplifier 504 is used to amplify the signal 605 and only when the signal energy exceeds a threshold (−Vth or +Vth for example), does the peaking amplifier 506 amplify the signal 605.

Figure 7A:
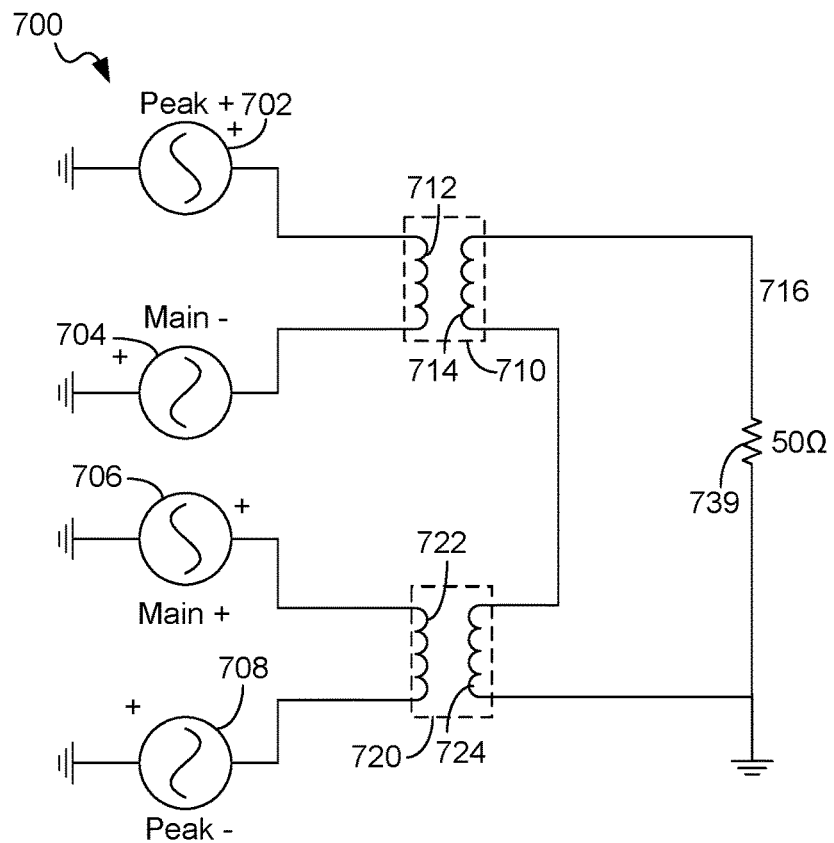
FIG. 7A is a diagram showing an example of a voltage mode amplifier configured to operate in a peak power (Psat) mode.

FIG. 7A is a diagram showing an example of a voltage mode amplifier 700 configured to operate in a peak power (Psat) mode. The voltage mode amplifier 700 may be an example of one or more of the amplifiers of FIG. 3. The voltage mode amplifier 700 includes a peaking+ voltage source 702, a main− voltage source 704, a main+ voltage source 706, and a peaking− voltage source 708. In an exemplary embodiment, the peaking+ voltage source 702, the main− voltage source 704, the main+ voltage source 706, and the peaking− voltage source 708 may comprise an implementation of the main amplifier 504 and the peaking amplifier 506 of FIG. 5. The example of the voltage mode amplifier shown in FIG. 7A is a primary load modulated voltage mode Doherty amplifier, where a main amplifier and a peaking amplifier are each coupled to one of two transformers. Other configurations are possible, such as a secondary load modulated voltage mode Doherty amplifier, where a main amplifier is coupled to one transformer and the peaking amplifier is coupled to another transformer.

In an exemplary embodiment, the peaking+ voltage source 702 and the main− voltage source 704 may be coupled to the primary side 712 of a transformer 710. The secondary side 714 of the transformer 710 may be coupled to a load resistor 739.

The main+ voltage source 706 and the peaking− voltage source 708 may be coupled to the primary side 722 of a transformer 720. The secondary side 724 of the transformer 710 may be coupled to the load resistor 739.

In an exemplary embodiment, the arrangement of the voltage mode main amplifier 704, 706; and the voltage mode peaking amplifier 702, 708 in the voltage mode amplifier 700 eliminates the elements that perform impedance inversion and impedance transformation. In an exemplary embodiment, the voltage mode amplifier 700 represents a Doherty amplifier configured to provide peak power, that is, operation at a power level corresponding to Psat.

Figure 7B:
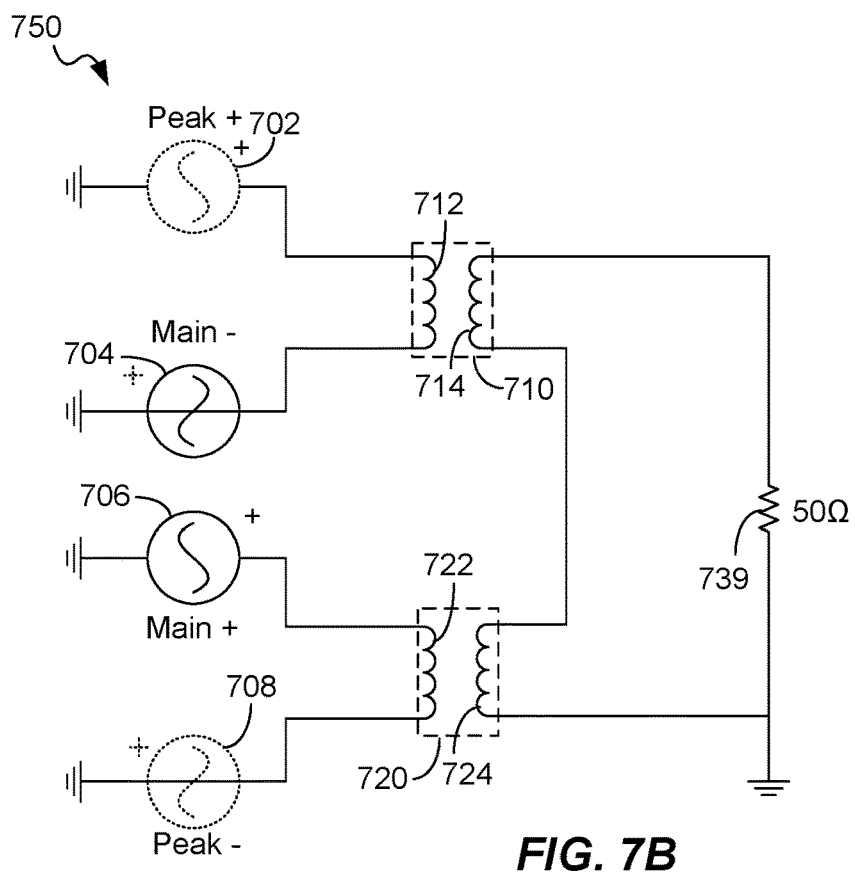
FIG. 7B is a diagram showing an example of a voltage mode amplifier configured to operate in a backoff power mode.

FIG. 7B is a diagram showing an example of the voltage mode amplifier 700 of FIG. 7A configured to operate in a backoff power mode. The voltage mode amplifier 750 includes the peaking+ voltage source 702, the main− voltage source 704, the main+ voltage source 706, and the peaking− voltage source 708. However, in the example shown in FIG. 7B, the peaking+ voltage source 702 and the peaking− voltage source 708 are shown in phantom line to denote that they are non-operating, or switched off. In an exemplary embodiment, the peaking+ voltage source 702, the main− voltage source 704, the main+ voltage source 706, and the peaking− voltage source 708 may comprise an implementation of the main amplifier 504 and the peaking amplifier 506 of FIG. 5.

In FIG. 7A, the voltage mode amplifier 700 shows that with all voltage sources, the peaking+ voltage source 702, the main− voltage source 704, the main+ voltage source 706, and the peaking− voltage source 708 operating, the output across the load resistor 739 is maximum power, Psat.

In FIG. 7B, the voltage mode amplifier 750 shows that with a portion of the voltage sources non-operating, in this example, the peaking+ voltage source 702 and the peaking− voltage source 708, the output across the load resistor 739 is less than maximum power, for example at a backoff power. In some examples, the amplifier operates at 6 dB less power, which may be referred to as 6 dB backoff.

Figure 8:
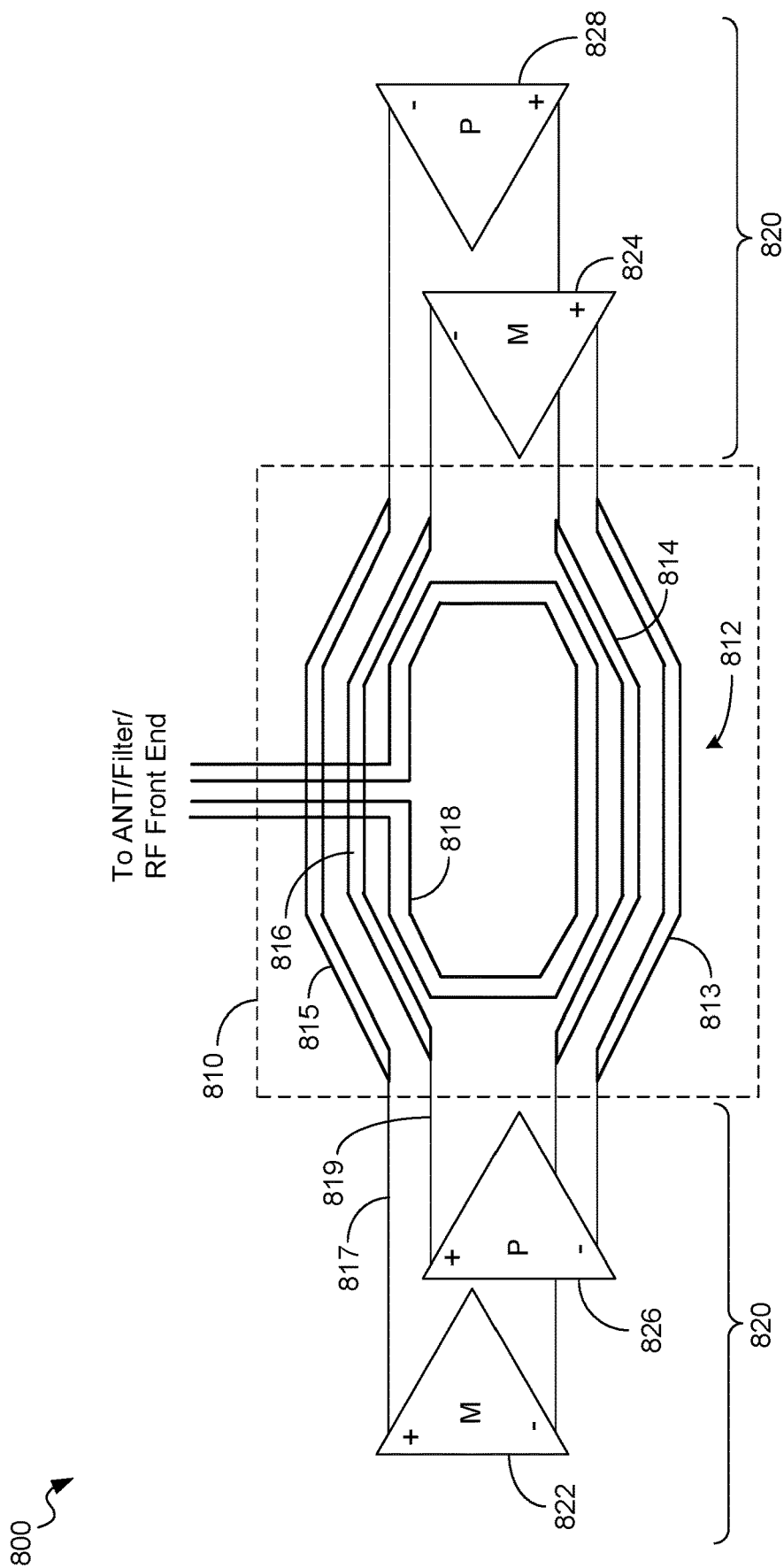
FIG. 8 is a schematic diagram illustrating an exemplary embodiment of a distributed active, power combining power amplifier.

FIG. 8 is a schematic diagram illustrating an exemplary embodiment of a distributed active, power combining power amplifier. The distributed active, power combining power amplifier 800 may be an example of the amplifier 324 and the transformer 316 of FIG. 3. In an exemplary embodiment, the distributed active, power combining power amplifier will be described as a voltage mode Doherty amplifier; however, other voltage mode power amplifier architectures may be used. In an exemplary embodiment, the distributed active, power combining power amplifier 800 includes a transformer 810 having a primary side 812 and a secondary side 818. In an exemplary embodiment, the primary side 812 may comprise multiple segments, and in this exemplary embodiment, comprises primary segment 813, primary segment 814, primary segment 815 and primary segment 816.

The secondary side 818, in this example, comprises a single segment and may be coupled to an antenna, a front end module, a filter, an RF front end, etc. Although shown as having a particular shape, the transformer 810 may be implemented in various shapes and configurations. In an exemplary embodiment, the primary side 812 and/or the secondary side 818 may be implemented using slab inductor elements.

In an exemplary embodiment, an amplifier 820, such as a driver amplifier, a power amplifier, or another amplifier, may be divided into main and peaking portions and may be represented by main portion 822, main portion 824, peaking portion 826 and peaking portion 828. The amplifier 820 may be a single instance of a voltage mode amplifier of FIGS. 7A and 7B, and in an exemplary embodiment may be implemented using a Doherty architecture or any other voltage mode amplifier (e.g., voltage mode PA) configuration. Each amplifier portion may be equal in size and have the same or similar operating characteristics or may comprise portions having different amplifier size and different amplifier characteristics. In an exemplary embodiment, the main portion 822 and the main portion 824 may comprise two (2) equal amplifier portions; and the peaking portion 826 and the peaking portion 828 may comprise two (2) equal amplifier portions. In an exemplary embodiment, the main portion 822, main portion 824, peaking portion 826 and peaking portion 828 may comprise four (4) equal amplifier portions. In other exemplary embodiments, the main portion 822, main portion 824, peaking portion 826 and peaking portion 828 may be unequal in size and unequal in operating characteristics.

In an exemplary embodiment, the main portion 822, main portion 824, peaking portion 826 and peaking portion 828 are symmetrically coupled to respective symmetrical segments of the primary side 812 of the transformer 810. For example, the positive (+) output of the main portion 822 is coupled to one side of the primary segment 815 and the negative (−) output of the main portion 822 is coupled to one side of the primary segment 814. Similarly, the positive (+) output of the main portion 824 is coupled to one side of the primary segment 813 and the negative (−) output of the main portion 824 is coupled to one side of the primary segment 816.

In an exemplary embodiment, the positive (+) output of the peaking portion 826 is coupled to one side of the primary segment 816 and the negative (−) output of the peaking portion 826 is coupled to one side of the primary segment 813. Similarly, the positive (+) output of the peaking portion 828 is coupled to one side of the primary segment 814 and the negative (−) output of the peaking portion 828 is coupled to one side of the primary segment 815.

Stated differently, the primary segment 813 is coupled to main portion 824 and peaking portion 826, the primary segment 814 is coupled to main portion 822 and peaking portion 828, the primary segment 816 is coupled to main portion 824 and peaking portion 826, and the primary segment 815 is coupled to main portion 822 and peaking portion 828.

In an exemplary embodiment, a first primary loop 817 is formed by the main portion 822, primary segment 815, peaking portion 828 and primary segment 814. Similarly, a second primary loop 819 is formed by the main portion 824, primary segment 813, peaking portion 826 and primary segment 816. The proximity of the primary segments 813, 814, 815 and 816 to each other, and because there is always current flowing in the first primary loop 817 and the second primary loop 819 because the main portion 822 is always on and coupled to the first primary loop 817 and the main portion 824 is always on and coupled to the second primary loop 819, even if peaking portions 826 and 828 may be turned off, the loops 817 and 819 are considered to be strongly coupled. The loops 817 and 819 are considered to be strongly coupled because they are always coupled to a main amplifier portion and because there is always current flowing in the loops 817 and 819.

In an exemplary embodiment, each loop 817 and 819 has a main portion and a peaking portion. The first loop 817 includes main portion 822 and peaking portion 828; and the second loop 819 includes main portion 824 and peaking portion 826.

In an exemplary embodiment, the symmetrical coupling of the main portions 822 and 824, and the peaking portions 826 and 828 to the primary segments 813, 814, 815 and 816 results in a symmetrical architecture that improves Psat and that also provides increased efficiency at power backoff.

Operating the main portions 822 and 824, and the peaking portions 826 and 828 as voltage-mode Doherty (VMD) amplifiers may also improve efficiency at backoff power. In the arrangement shown in FIG. 8, dividing the amplifier driver cells into main portions 822 and 824, and peaking portions 826 and 828 that feed symmetrical primary side transformer segments 813, 814, 815 and 816 provides a symmetry that increases the impedance at the transformer's primary side 812 when the peaking portions 826 and 828 are turned off, which might occur in a backoff power situation. Increasing the impedance at the transformer's primary side 812 reduces the loss of the main portions 822 and 824, thus improving efficiency when the peaking portions 826 and 828 are turned off. For example, it is possible to turn off the peaking portions 826 and 828 when it is desirable to emit less power (for example, backoff power). In this example, when the peaking portions 826 and 828 are turned off, the symmetrical nature of the main portions 822 and 824, and the peaking portions 826 and 828, together with the symmetrical arrangement of the primary segments 813, 814, 815 and 816 of the transformer 810 allows the secondary side 818 of the transformer 810 to observe ½ the power (in this example), while the impedance increase at the transformer's primary side 812 when the peaking portions 826 and 828 are turned off reduces the loss of the main portions 822 and 824, thus improving efficiency. In this manner, efficiency at backoff power is locally maximized.

Figure 9:
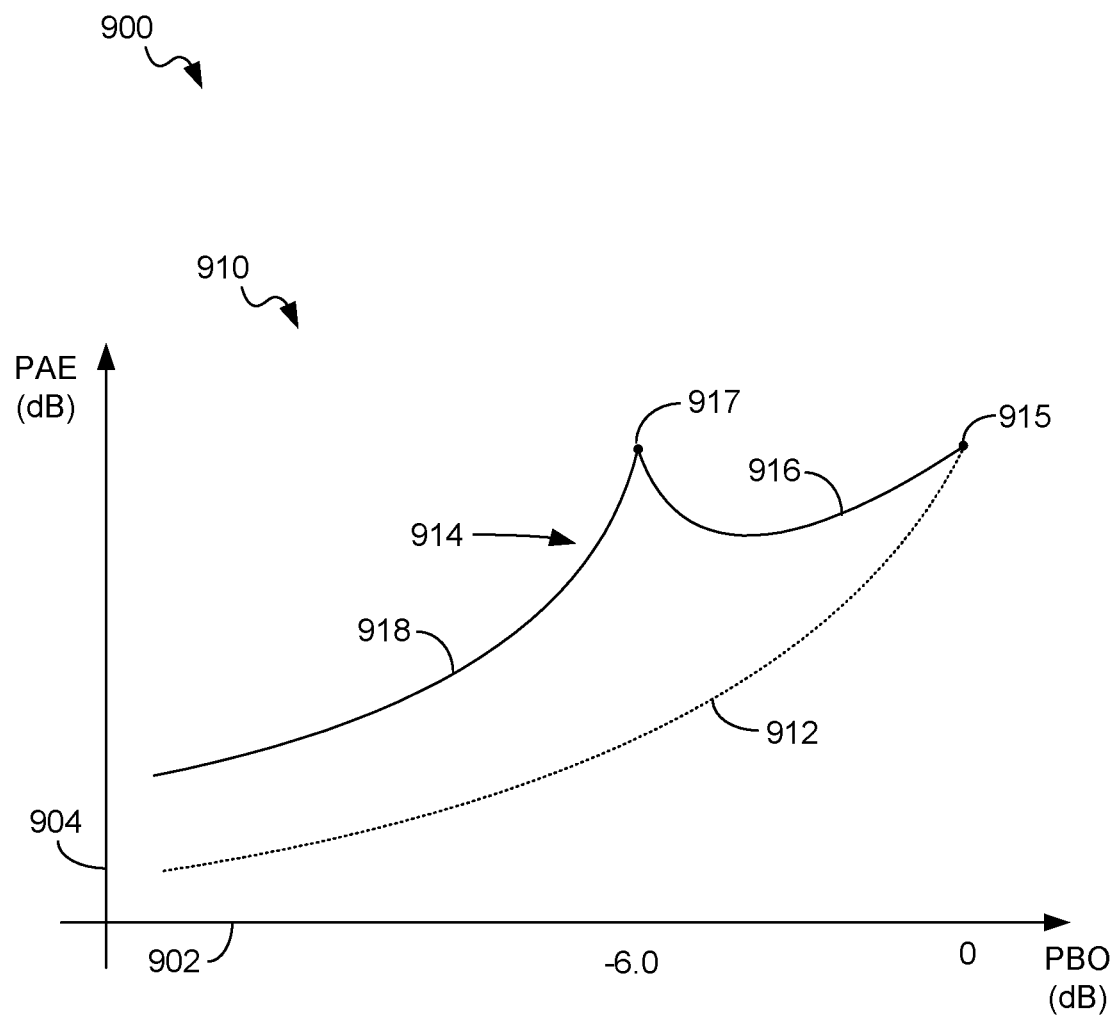
FIG. 9 is a drawing showing a graphical example of the operation of the exemplary embodiment of the distributed active, power combining power amplifier of FIG. 8.

FIG. 9 is a drawing 900 showing a graphical example of the operation of the exemplary embodiment of the distributed active, power combining power amplifier of FIG. 8. The graph 910 includes a horizontal axis 902 showing power backoff (PBO) in dB and a vertical axis 904 showing power added efficiency (PAE) in dB. The trace 912 shows a baseline power amplifier output versus PAE in phantom line with the point 915 representing maximum power, Psat, that is 0 dB backoff.

The trace 914 represents the operation of the exemplary distributed active, power combining power amplifier 800 shown in FIG. 8. The trace 914 includes portions 916 and 918. As the maximum power is reduced from the Psat point 915, the portion 916 of the trace 914 shows an initial decrease in efficiency as power is reduced. As the power backoff reaches −6 dB at point 917, the efficiency recovers to approximately the same level as the efficiency of Psat at point 915, for example due to the peaking portions 826 and 828 being turned off. The PAE between the point 915 and the point 917 may be within a certain range (e.g., the minimum of the PAE between point 915 and point 917 may be less than 5 dB lower than the PAE at point 915 and/or 917, for example less than 3 dB or less than 1 dB lower than the highest PAE in some implementations) or may be within a certain percentage (e.g., the minimum of the PAE between point 915 and point 917 may be within 15% of the PAE at point 915 and/or 917, for example within 10%, 5%, 3%, or even 1% of the highest PAE in some implementations), depending on application. Thus, a reduced PAE between the point 915 and the point 917 may be maintained to be similar to the PAE (e.g., maximum PAE) at point 915. The portion 918 of the trace 914 then shows efficiency degradation as power is further reduced from the −6 dB back off point 917. In some examples, the peaking portions 826 and 828 are turned off during the portion 918. While the PAE of points 917 and 915 are approximately equal in this embodiment, the PAE at these points may be different in other embodiments, for example depending on the configuration of the portions 822, 824 as compared to the portions 826, 828.

Referring also to FIG. 8. in an exemplary embodiment, as described above the loop 817 formed by the main portion 822, primary segment 815, peaking portion 828 and primary segment 814, and the loop 819 formed by the main portion 824, primary segment 813, peaking portion 826 and primary segment 816 (FIG. 8) are strongly coupled.

For example, when the peaking portions 826 and 828 are turned off, there is still current flowing in the first primary loop 817 and in the second primary loop 819 because the main portion 822 is coupled to the first primary loop 817 and the main portion 824 is coupled to the second primary loop 819. When the peaking portions 826 and 828 are turned off they appear as capacitances; however, the strong coupling between the first primary loop 817 and second primary loop 819 helps to distribute the capacitive effect of the peaking portions 826 and 828 being turned off. In this manner, efficiency at power backoff is locally maximized when one or more of the peaking portions 826 and 828 are turned off.

Figure 10:
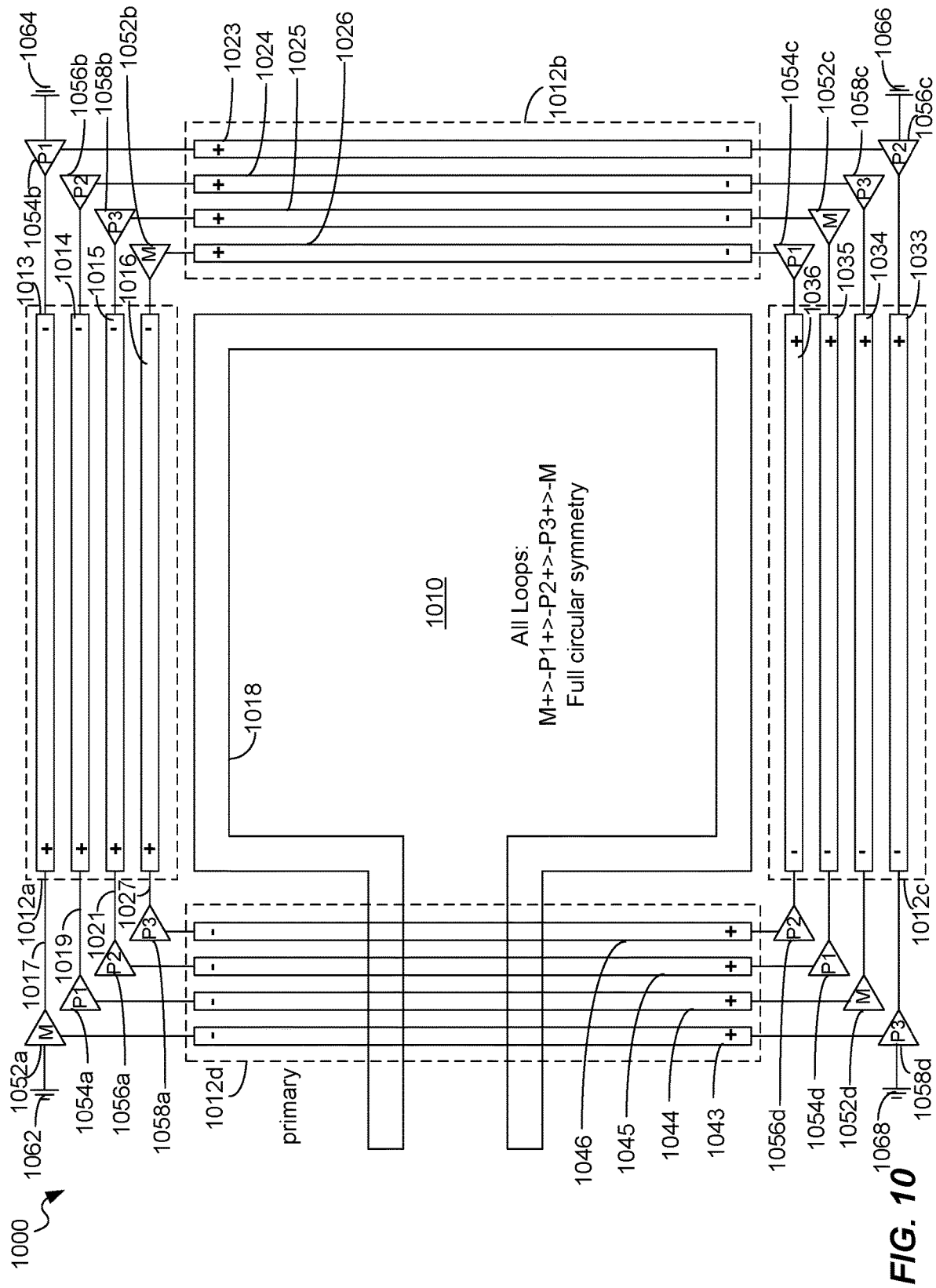
FIG. 10 is a schematic diagram illustrating another exemplary embodiment of a distributed active, power combining power amplifier.

FIG. 10 is a schematic diagram illustrating another exemplary embodiment of a distributed active, power combining power amplifier 1000. In an exemplary embodiment, the distributed active, power combining power amplifier is configured as a voltage mode Doherty amplifier; however, other power amplifier architectures may be used. The distributed active, power combining power amplifier 1000 includes a transformer 1010 having a primary side 1012 and a secondary side 1018. In an exemplary embodiment, the primary side 1012 may be divided into four (4) sets of four (4) segments each, such that a transformer ratio of 4:1 between the primary side 1012 and the secondary side 1018 is established.

In an exemplary embodiment, a first primary set 1012a may comprise primary segments 1013, 1014, 1015 and 1016; a second primary set 1012b may comprise primary segments 1023, 1024, 1025 and 1026; a third primary set 1012c may comprise primary segments 1033, 1034, 1035 and 1036, and a fourth primary set 1012d may comprise primary segments 1043, 1044, 1045 and 1046.

In an exemplary embodiment, a main amplifier (M) 1052 may be divided into main portions 1052a, 1052b, 1052c and 1052d. In an exemplary embodiment, a first peaking amplifier (P1) 1054 may be divided into first peaking portions 1054a, 1054b, 1054c and 1054d; a second peaking amplifier (P2) 1056 may be divided into second peaking portions 1056a, 1056b, 1056c and 1056d; and a third peaking amplifier (P3) 1058 may be divided into third peaking portions 1058a, 1058b, 1058c and 1058d.

In an exemplary embodiment, a first primary loop 1017 may be formed by coupling a positive (+) output of the main portion 1052a and the negative (−) output of the first peaking portion 1054b to the primary segment 1013; coupling the positive (+) output of the first peaking portion 1054b and the negative (−) output of the second peaking portion 1056c to the primary segment 1023; coupling the positive (+) output of the second peaking portion 1056c and the negative (−) output of the third peaking portion 1058d to the primary segment 1033; and coupling the positive (+) output of the third peaking portion 1058d and the negative (−) output of the main portion 1052a to the primary segment 1043.

In an exemplary embodiment, a second primary loop 1019 may be formed by coupling a positive (+) output of the first peaking portion 1054a and the negative (−) output of the second peaking portion 1056b to the primary segment 1014; coupling the positive (+) output of the second peaking portion 1056b and the negative (−) output of the third peaking portion 1058c to the primary segment 1024; coupling the positive (+) output of the third peaking portion 1058c and the negative (−) output of the main portion 1052d to the primary segment 1034; and coupling the positive (+)

output of the main portion 1052d and the negative (−) output of the first peaking portion 1054a to the primary segment 1044.

In an exemplary embodiment, a third primary loop 1021 may be formed by coupling a positive (+) output of the second peaking portion 1056a and the negative (−) output of the third peaking portion 1058b to the primary segment 1015; coupling the positive (+) output of the third peaking portion 1058b and the negative (−) output of the main portion 1052c to the primary segment 1025; coupling the positive (+) output of the main portion 1052c and the negative (−) output of the first peaking portion 1054d to the primary segment 1035; and coupling the positive (+) output of the first peaking portion 1054d and the negative (−) output of the second peaking portion 1056a to the primary segment 1045.

In an exemplary embodiment, a fourth primary loop 1027 may be formed by coupling a positive (+) output of the third peaking portion 1058a and the negative (−) output of the main portion 1052b to the primary segment 1016; coupling the positive (+) output of the main portion 1052b and the negative (−) output of the first peaking portion 1054c to the primary segment 1026; coupling the positive (+) output of the first peaking portion 1054c and the negative (−) output of the second peaking portion 1056d to the primary segment 1036; and coupling the positive (+) output of the second peaking portion 1056d and the negative (−) output of the third peaking portion 1058a to the primary segment 1046.

The symmetry provided by coupling the positive and negative outputs of the portions of the main amplifier 1052, first peaking amplifier 1054, second peaking amplifier 1056 and third peaking amplifier 1058 as shown establishes the ground connections 1062, 1064, 1066 and 1068 at the corners of the transformer 1010 as virtual grounds. A virtual ground may be created when the differential current from the positive and negative outputs of the amplifier portions cancel each other.

The transformer and amplifier architecture shown in FIG. 10 forms a distributed active combiner that provides improved efficiency at power backoff. In the exemplary embodiment shown in FIG. 10, the transformer is a 4:1 combiner and the amplifiers are divided into four (4) instances each of the main amplifier 1052, first peaking amplifier (P1) 1054, second peaking amplifier (P2) 1056, and third peaking amplifier (P3) 1058; and the inductor that may form the primary side 1012 may comprise a slab inductor that is divided into four (4) sets of four (4) segments each, with each one segment of each set together with the amplifier instances forming four symmetric loops 1017, 1019, 1021 and 1027.

In an exemplary embodiment, each loop couples an instance of a main amplifier (M) 1052, a first peaking amplifier (P1) 1054, a second peaking amplifier (P2) 1056 and a third peaking amplifier (P3) 1058, in a rotating symmetrical pattern, so each loop 1017, 1019, 1021 and 1027 has an instance of each amplifier portion as described above. Each loop has one instance of four amplifier portions with each amplifier instance being separately controllable so that any combination of the loops 1017, 1019, 1021 and 1027 can be on.

If one peaking amplifier, such as for example, the portions of the first peaking amplifier 1054, are turned off then four (4) instances of 16 amplifier portions are off, and the power is reduced by a first backoff. For example, the first backoff may be approximately 3 dB (−3 dB back off). However, due to the symmetry of the connections of the amplifiers to the primary portions of the transformer, the secondary side 1018 only sees that the power has been reduced by 3 dB. The symmetry of the connections of the amplifiers to the primary portions of the transformer allows the PAE of the distributed active, power combining power amplifier 1000 to be substantially maintained when power is reduced from Psat to power less than Psat (backoff power).

If in addition to the portions of the first peaking amplifier 1054, one of the second peaking portion (P2) 1056 or the third peaking portion (P3) 1058 are turned off, then in this example one-half of the drivers are off and because an instance of the main portion 1052 remains at every corner of the primary side 1012, and the other of the second peaking portion (P2) 1056 or the third peaking portion (P3) 1058 remains on in this example, the secondary side 1018 sees only a power reduction, with no fluctuation in the impedance or impedance transformation.

While the embodiment illustrated in FIG. 10 includes a secondary side with four sides, four primary loops, and 4:1 combining, embodiments are not limited thereto. For example, two primary loops may surround the four sides of the secondary side. In such embodiment, each primary segment may be disposed adjacent two sides of the secondary side, and 2:1 combining may be implemented. In other embodiments, the secondary side may be configured with eight sides, for example in an equiangular or other octagonal shape. There may be a corresponding number (e.g., 8) of primary loops, or a fewer number of primary loops. Each primary loop may include a main portion and one or more peaking portions (where the number of peaking portions is one less than the number of primary loops). The primary loops may be symmetrically disposed about the secondary side, for example such that the primary portions are equally distributed around the secondary side. Thus, the transformer 1010 may be configured in any number of shapes and may effect any of various combining ratios pursuant to a selected number of primary loops (which may vary between different embodiments). It can be seen that the primary loops are concentric in the amplifier 1000. In contrast, the primary loops in the amplifier 800 cross each other. For example, the main portion 822 is coupled to one primary segment (815) which is farther from the secondary side 818 (e.g., as compared to primary segment 816) and one primary segment (814) which is nearer to the secondary side 818 (e.g., as compared to primary segment 814), as opposed to being coupled to two primary segments that are either both nearer to the secondary side 818 or both farther from the secondary side 818.

Either or both of the amplifiers 800 and 1000 may be configured as a digital power amplifier and/or used in a digital transmitter architecture. In other examples, the amplifier 800 or the amplifier 1000 may be used in an analog configuration. In some examples, the amplifier 800 or 1000 is configured to amplify an orthogonal frequency-division multiplexing (OFDM) signal.

Figure 11:
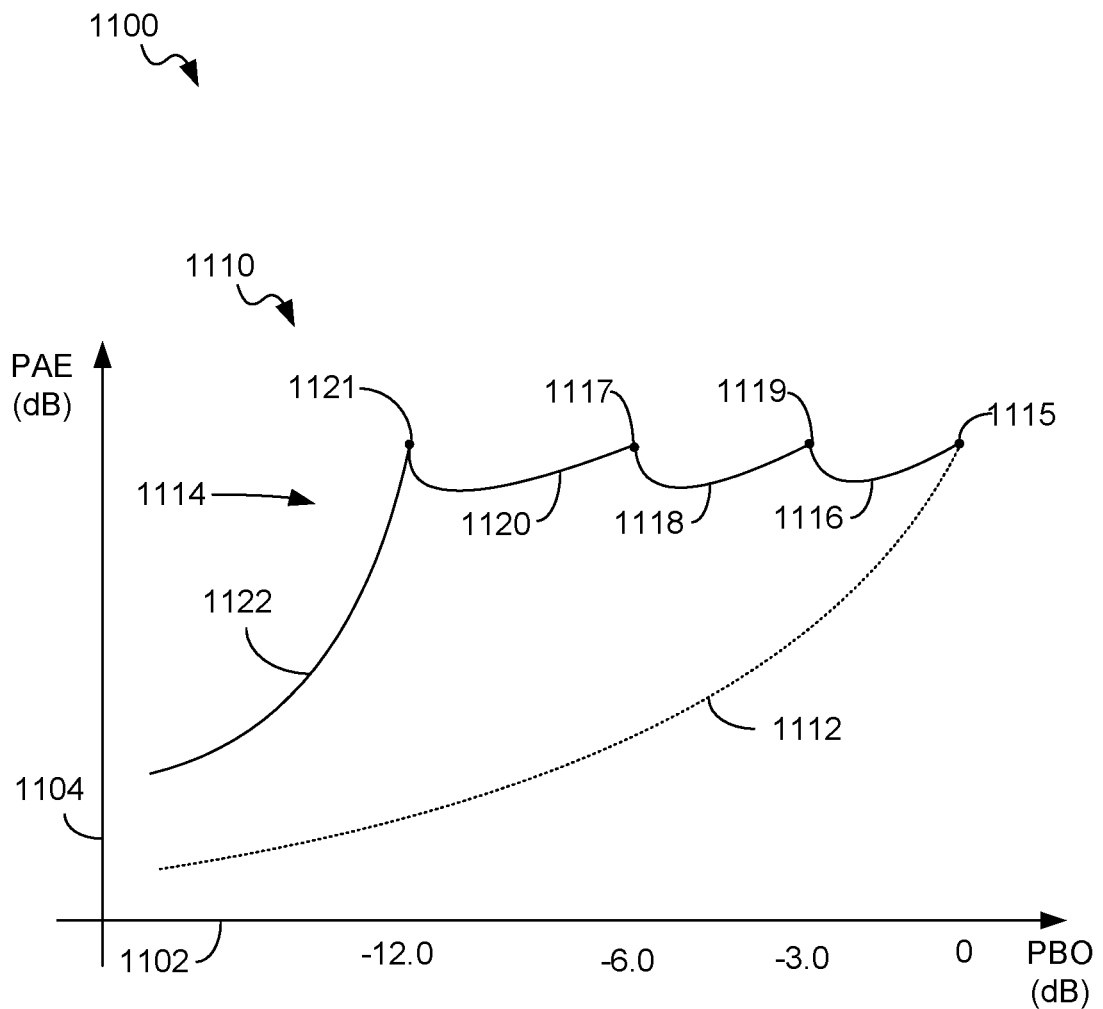
FIG. 11 is a drawing of a graph showing an example of the operation of the exemplary embodiment of the distributed active, power combining power amplifier of FIG. 10.

FIG. 11 is a drawing 1100 showing a graphical example of the operation of the exemplary embodiment of the distributed active, power combining power amplifier of FIG. 10. The graph 1110 includes a horizontal axis 1102 showing power backoff (PBO) in dB and a vertical axis 1104 showing power added efficiency (PAE) in dB. The trace 1112 shows a baseline power amplifier output versus PAE in phantom line with the point 1115 representing maximum power, Psat, that is 0 dB backoff.

The trace 1114 represents the operation of the exemplary distributed active, power combining power amplifier 1000 shown in FIG. 10. The trace 1114 includes portions 1116, 1118, 1120 and 1122.

As the maximum power is reduced from the Psat point 1115 by reducing power and eventually turning off one of the peaking amplifier portions of FIG. 10, the portion 1116 of the trace 1114 shows an initial decrease in efficiency as power is reduced. As the power backoff reaches the first backoff (−3 dB in the embodiment of FIG. 11) at point 1119, the efficiency recovers to approximately the same level as the efficiency of Psat at point 1115 in the illustrated embodiment. In other embodiments, the efficiency may exhibit a local maximum that differs from the point 1115 at approximately the first backoff.

As the maximum power is further reduced by reducing the power and eventually turning off two of the peaking amplifier portions of FIG. 10, the portion 1118 of the trace 1114 shows another decrease in efficiency as power is reduced. As the power backoff reaches a second backoff (−6 dB in the embodiment of FIG. 11) at point 1117, the efficiency again recovers to approximately the same level as the efficiency of Psat at point 1115 (or to a different local maximum).

As the maximum power is further reduced by reducing the power and eventually turning off three of the peaking amplifier portions of FIG. 10, the portion 11120 of the trace 1114 shows another decrease in efficiency as power is reduced. As the power backoff reaches a third backoff (−12 dB in the embodiment of FIG. 11) at point 1121, the efficiency again recovers to approximately the same level as the efficiency of Psat at point 1115 (or to a different local maximum). The portion 1122 of the trace 1114 then shows further efficiency degradation as power is further reduced from the −12 dB back off point 1121. It will be understood that the first, second, and third backoffs may be equally spaced from each other (e.g., at multiples of −3 dB), or the spacing therebetween may vary (as illustrated in FIG. 11) depending on the configurations of the main and peaking portions of the primary loops. The PAE between the point 1115 and the point 1121 may be within a certain range (e.g., the lowest local minimum of the PAE between point 1115 and point 1121 may be less than 5 dB lower than the PAE at point 1115, 1117, 1119, and/or 1121, for example less than 3 dB or less than 1 dB lower than the highest PAE in some implementations) or may be within a certain percentage (e.g., the minimum of the PAE between point 1115 and point 1121 may be within 15% of the PAE at point 1115, 1117, 1119, and/or 1121, for example within 10%, 5%, 3%, or even 1% of the highest PAE in some implementations), depending on application. Thus, a PAE reduced anywhere between the point 1115 and the point 1121 may be maintained to be similar to the PAE (e.g., maximum PAE) at point 1115.

Figure 12:
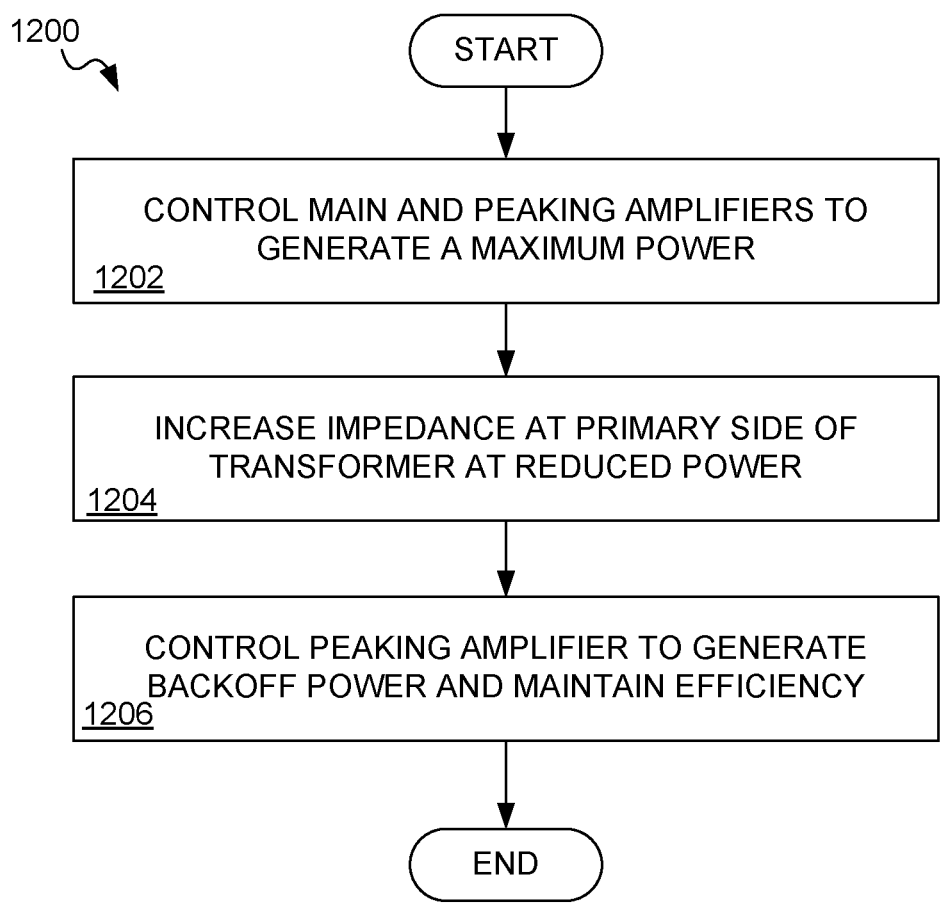
FIG. 12 is a flow chart describing an example of a method for providing efficient power.

FIG. 12 is a flow chart 1200 describing an example of a method for providing efficient power. The blocks in the method 1200 can be performed in or out of the order shown, and in some embodiments, can be performed at least in part in parallel.

In block 1202, main amplifier portions and peaking amplifier portions are controlled to generate a maximum power. For example, the main portions 822 and 824 and the peaking portions 826 and 828 of the amplifier 820 of FIG. 8 may be controlled to generate a maximum power, Psat. Alternatively, the main amplifier (M) 1052, first peaking amplifier (P1) 1054, second peaking amplifier (P2) 1056 and third peaking amplifier (P3) 1058 of FIG. 10 may be controlled to generate a maximum power, Psat.

In block 1204, the impedance at the primary side of a transformer is increased. For example, dividing the amplifier cells into main portions 822 and 824, and peaking portions 826 and 828 that feed symmetrical primary side transformer segments 813, 814, 815 and 816 provides a symmetry that increases the impedance at the transformer's primary side 812 when the peaking portions 826 and 828 are turned off. In block 1206, the peaking amplifier portions are controlled to generate backoff power and maintain efficiency. For example, the peaking portions 826 and 828 of the amplifier 820 of FIG. 8 may be controlled to be turned off such that the amplifier 820 is operating at a backoff power while the arrangement of the transformer 810 and the main portions 822 and 824 maintains efficiency. Alternatively, one or more of the first peaking amplifier (P1) 1054, second peaking amplifier (P2) 1056 and third peaking amplifier (P3) 1058 of FIG. 10 may be controlled to be turned off such that the amplifiers 1052, 1054, 1056 and 1058 are operating at a backoff power while the arrangement of the transformer 1010 and the main portions 1052*a*, 1052*b*, 1052*c* and 1052*d* maintains efficiency.

Figure 13:
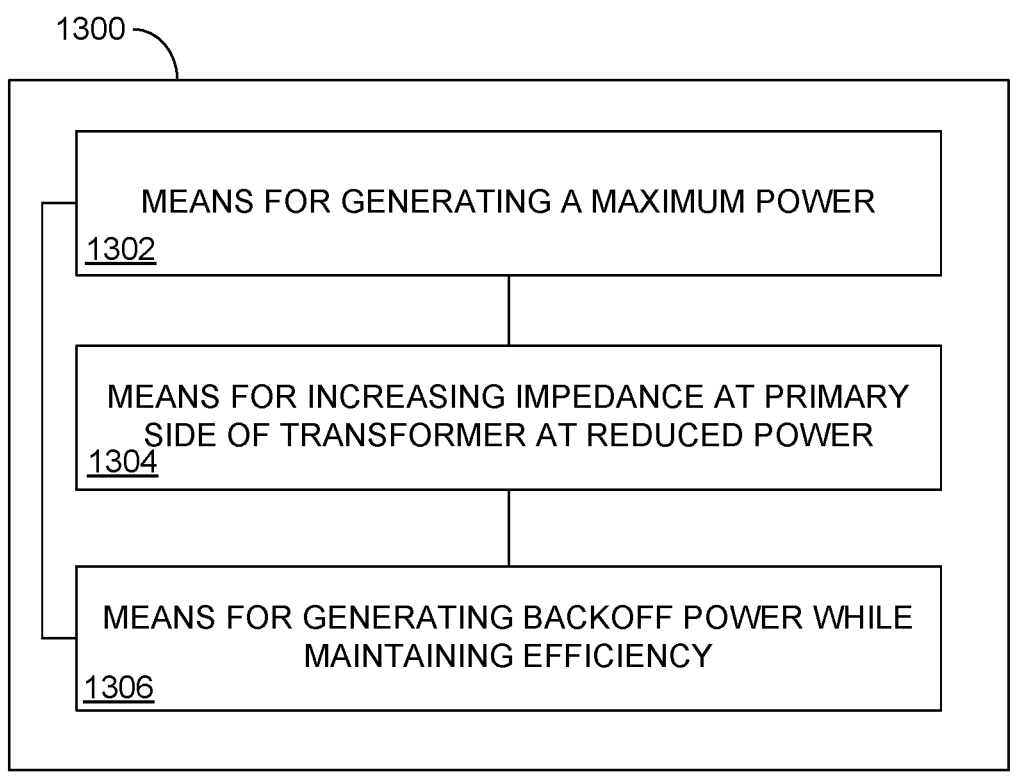
FIG. 13 is a functional block diagram of an apparatus for providing efficient power.

FIG. 13 is a functional block diagram of an apparatus 1300 for providing efficient power. The apparatus 1300 comprises means 1302 for generating a maximum power. In certain embodiments, the means 1302 for generating a maximum power can be configured to perform one or more of the functions described in operation block 1202 of method 1200 (FIG. 12). In an exemplary embodiment, the means 1302 for generating a maximum power may comprise the main portions 822 and 824 and the peaking portions 826 and 828 of the amplifier 820 of FIG. 8, for example configured to generate a maximum power Psat. Alternatively, the main amplifier (M) 1052, first peaking amplifier (P1) 1054, second peaking amplifier (P2) 1056 and third peaking amplifier (P3) 1058 of FIG. 10 may be controlled to generate a maximum power Psat.

The apparatus 1300 also comprises means 1304 for increasing the impedance at the primary side of a transformer. In certain embodiments, the means 1304 for increasing the impedance at the primary side of a transformer can be configured to perform one or more of the functions described in operation block 1204 of method 1200 (FIG. 12). In an exemplary embodiment, the means 1304 for increasing the impedance at the primary side of a transformer may comprise the amplifier cells divided into main portions 822 and 824, and peaking portions 826 and 828, which are configured to feed symmetrical primary side transformer segments 813, 814, 815 and 816, which may provide a symmetry that increases the impedance at the transformer's primary side 812 when the peaking portions 826 and 828 are turned off.

The apparatus 1300 also comprises means 1306 for generating backoff power and maintaining efficiency. In certain embodiments, the means 1306 for generating backoff power and maintaining efficiency can be configured to perform one or more of the functions described in operation block 1206 of method 1200 (FIG. 12). In an exemplary embodiment, the means 1306 for generating backoff power and maintaining efficiency may comprise the peaking portions 826 and 828 of the amplifier 820 of FIG. 8, for example configured to be turned off such that the amplifier 820 is operating at a backoff power while the arrangement of the transformer 810 and the main portions 822 and 824 maintains efficiency. Alternatively, one or more of the first peaking amplifier (P1) 1054, second peaking amplifier (P2) 1056 and third peaking amplifier (P3) 1058 of FIG. 10 may be turned off such that the amplifiers 1052, 1054, 1056 and 1058 are operating at a backoff power while the arrangement of the transformer 1010 and the main portions 1052*a*, 1052*b*, 1052*c* and 1052*d* maintains efficiency.

Exemplary embodiments of a distributed active, power combining power amplifier may be implemented on silicon as a WiFi power amplifier to provide a high saturated power and to provide high efficiency at backoff power. Exemplary embodiments of a distributed active, power combining power amplifier may also be implemented as a Bluetooth power amplifier, or in any application where a power combining power amplifier may be implemented.

Certain descriptions herein refer to particular frequencies, values, device characteristics, etc. However, other frequencies, values, device characteristics are contemplated. For example, signal bandwidths, local oscillator (LO) frequencies, spurious signal frequencies, and other characteristics may differ from this escribed while remaining contemplated by the embodiments of the disclosure. Similarly, device technologies used to fabricate the switches and elements described here may differ while remaining contemplated by the embodiments of the disclosure.

Example embodiments are described in the following numbered clauses.

1. A distributed active, power combining amplifier, comprising: at least one main amplifier having a first main portion and a second main portion; at least one peaking amplifier having a first peaking portion and a second peaking portion; and a transformer having a primary side and a secondary side, the primary side having at least a first primary segment, a second primary segment, a third primary segment and a fourth primary segment; wherein the first main portion is coupled to the first primary segment and the second primary segment, the first peaking portion is coupled to the first primary segment or the second primary segment, the second main portion is coupled to the third primary segment and the fourth primary segment, and the second peaking portion is coupled to the third primary segment or the fourth primary segment in a symmetric architecture.

2. The amplifier of clause 1, wherein the amplifier is configured to always flow a current in the primary side of the transformer using the at least one main amplifier when the amplifier is amplifying a signal.

3. The amplifier of any of clauses 1 or 2, wherein a positive output of the first main portion is coupled to the first primary segment, a negative output of the first main portion is coupled to the second primary segment, a positive output of the second main portion is coupled to the third primary segment, a negative output of the second main portion is coupled to the fourth primary segment, a negative output of the first peaking portion is coupled to the first primary segment, a positive output of the first peaking portion is coupled to the second primary segment or a first other primary segment, a negative output of the second peaking portion is coupled to the third primary segment, and a positive output of the second peaking portion is coupled to the fourth primary segment or a second other primary segment.

4. The amplifier of any of clauses 1 through 3, wherein: the first main portion and the second main portion have the same operating characteristics; and the first peaking portion and the second peaking portion have the same operating characteristics.

5. The amplifier of any of clauses 1 through 3, wherein: the first main portion and the second main portion have different operating characteristics; and the first peaking portion and the second peaking portion have different operating characteristics.

6. The amplifier of any of clauses 1 through 5, wherein at least one of the first main portion and the second main portion, and at least one of the first peaking portion and the second peaking portion are coupled to at least two primary segments selected from the first primary segment, the second primary segment, the third primary segment and the fourth primary segment to form a loop.

7. The amplifier of any of clauses 1 through 6, wherein the at least one peaking amplifier is configured to be turned off to generate a backoff power.

8. The amplifier of clause 7, wherein when the at least one peaking amplifier is turned off an impedance at the transformer's primary side is increased.

9. The amplifier of any of clauses 1 through 2, wherein an impedance at the transformer's primary side is increased when at least one of the first peaking portion and second peaking portion are turned off.

10. The amplifier of clause 6, further comprising a plurality of loops, wherein each loop comprises a main amplifier portion and a peaking amplifier portion.

11. The amplifier of clause 10, wherein each loop comprises a plurality of segments coupled to at least one main amplifier portion and a plurality of peaking amplifier portions that is one fewer than a number of segments in the plurality of segments in the loop.

12. The amplifier of any of clauses 10 through 11, wherein each loop comprises a plurality of segments equal to a number of sides of the secondary side of the transformer.

13. The amplifier of any of clauses 10 through 12, wherein each loop comprises a plurality of segments that wrap around multiple sides of the secondary side of the transformer.

14. The amplifier of any of clauses 10 through 13, wherein the plurality of loops comprises four or more loops.

15. A method for operating an amplifier comprising a transformer, the method comprising: amplifying a communication signal to generate a maximum power;

increasing an impedance at a primary side of the transformer at a reduced power; and amplifying the communication signal to generate the reduced power while maintaining a power efficiency within a range of 3 dB.

16. The method of clause 15, wherein: the maximum power is generated by operating a main amplifier and a peaking amplifier; and the reduced power is generated by operating the main amplifier without the peaking amplifier.

17. The method of any of clauses 15 through 16, wherein the reduced power is generated by operating the main amplifier without the peaking amplifier, while maintaining an efficiency similar to an efficiency when the main amplifier and a peaking amplifier are both operated.

18. The method of clause 16, wherein: the main amplifier and the peaking amplifier have the same operating characteristics.

19. The method of clause 16, wherein: the main amplifier and the peaking amplifier have different operating characteristics.

20. The method of clause 17, wherein maintaining an efficiency similar to an efficiency when the main amplifier and a peaking amplifier are both operated comprises continuously flowing a current in the primary side of the transformer.

21. The method of clause 16, wherein: the maximum power is generated by operating the main amplifier and a plurality of peaking amplifiers; and the reduced power is generated by operating the main amplifier while successively turning off peaking amplifiers of the plurality of peaking amplifiers.

22. The method of clause 16, wherein without the peaking amplifier a loss of the main amplifier is reduced and an efficiency of the main amplifier at backoff power is improved as compared to operating the amplifier to achieve the backoff power without turning off any peaking amplifiers.

23. An amplifier, comprising: a transformer; means for amplifying a communication signal to generate a maximum power; means for causing an impedance increase at a primary side of the transformer at a reduced power; and means for amplifying the communication signal to generate the reduced power while maintaining a power efficiency within a range of 3 dB.

24. The amplifier of clause 23, wherein the means for amplifying the communication signal to generate the reduced power comprises means for maintaining an impedance transformation ratio at backoff power.

25. An amplifier, comprising: a plurality of main amplifier portions;
a plurality of peaking amplifier portions; a transformer having a primary side and a secondary side, the primary side having a plurality of primary segments; and a plurality of loops, each loop formed by a respective main amplifier portion of the plurality of main amplifier portions, one or more respective peaking amplifier portions of the plurality of peaking amplifier portions, and a two or more respective segments of the plurality of primary segments.

26. The amplifier of clause 25, wherein: the plurality of main amplifier portions comprises a first main portion and a second main portion, the first main portion and the second main portion having the same operating characteristics; and the plurality of peaking amplifier portions comprises a first peaking portion and a second peaking portion, the first peaking portion and the second peaking portion having the same operating characteristics.

27. The amplifier of clause 25, wherein: the plurality of main amplifier portions comprises a first main portion and a second main portion, the first main portion and the second main portion having different operating characteristics; and the plurality of peaking amplifier portions comprises a first peaking portion and a second peaking portion, the first peaking portion and the second peaking portion having different operating characteristics.

28. The amplifier of any of clauses 25 through 27, wherein: the plurality of loops are concentric.

29. The amplifier of any of clauses 25 through 28, wherein at least one of the plurality of peaking amplifier portions is configured to turn off to generate a backoff power.

30. The amplifier of any of clauses 25 through 29, wherein at least two of the plurality of loops cross.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A distributed active, power combining amplifier, comprising:
at least one main amplifier having a first main portion and a second main portion;
at least one peaking amplifier having a first peaking portion and a second peaking portion; and
a transformer having a primary side and a secondary side, the primary side having at least a first primary segment, a second primary segment, a third primary segment and a fourth primary segment;
wherein the first main portion is coupled to the first primary segment and the second primary segment, the first peaking portion is coupled to the first primary segment and the second primary segment, the second main portion is coupled to the third primary segment and the fourth primary segment, and the second peaking portion is coupled to the third primary segment and the fourth primary segment in a symmetric architecture of transformer loops.

2. The amplifier of claim 1, wherein the amplifier is configured to always flow a current in the primary side of the transformer using the at least one main amplifier when the amplifier is amplifying a signal.

3. The amplifier of claim 1, wherein a positive output of the first main portion is coupled to the first primary segment, a negative output of the first main portion is coupled to the second primary segment, a positive output of the second main portion is coupled to the third primary segment, a negative output of the second main portion is coupled to the fourth primary segment, a negative output of the first peaking portion is coupled to the first primary segment, a positive output of the first peaking portion is coupled to the second primary segment or a first other primary segment, a negative output of the second peaking portion is coupled to the third primary segment, and a positive output of the second peaking portion is coupled to the fourth primary segment or a second other primary segment.

4. The amplifier of claim 1, wherein:
the first main portion and the second main portion have the same operating characteristics; and
the first peaking portion and the second peaking portion have the same operating characteristics.

5. The amplifier of claim 1, wherein:
the first main portion and the second main portion have different operating characteristics; and
the first peaking portion and the second peaking portion have different operating characteristics.

6. The amplifier of claim 1, wherein at least one of the first main portion and the second main portion, and at least one of the first peaking portion and the second peaking portion are coupled to at least two primary segments selected from the first primary segment, the second primary segment, the third primary segment and the fourth primary segment to form a loop.

7. The amplifier of claim 1, wherein the at least one peaking amplifier is configured to be turned off to generate a backoff power.

8. The amplifier of claim 7, wherein when the at least one peaking amplifier is turned off an impedance at the transformer's primary side is increased.

9. The amplifier of claim 2, wherein an impedance at the transformer's primary side is increased when at least one of the first peaking portion and second peaking portion are turned off.

10. The amplifier of claim 6, further comprising a plurality of loops, wherein each loop comprises a main amplifier portion and a peaking amplifier portion.

11. The amplifier of claim 10, wherein each loop comprises a plurality of segments coupled to at least one main amplifier portion and a plurality of peaking amplifier portions that is one fewer than a number of segments in the plurality of segments in the loop.

12. The amplifier of claim 10, wherein each loop comprises a plurality of segments equal to a number of sides of the secondary side of the transformer.

13. The amplifier of claim 10, wherein each loop comprises a plurality of segments that wrap around multiple sides of the secondary side of the transformer.

14. The amplifier of claim 10, wherein the plurality of loops comprises four or more loops.

15. A method for operating an amplifier comprising a transformer, the method comprising:
amplifying a communication signal using at least one main amplifier having a first main portion and a second main portion, and at least one peaking amplifier having a first peaking portion and a second peaking portion to generate a maximum power;
increasing an impedance at a primary side of the transformer at a reduced power; and
amplifying the communication signal to generate the reduced power while maintaining a power efficiency within a range of 3 dB.

16. The method of claim 15, wherein:
the maximum power is generated by operating a main amplifier of the at least one main amplifier and a peaking amplifier of the at least one peaking amplifier; and
the reduced power is generated by operating the main amplifier without the peaking amplifier.

17. The method of claim 16, wherein the reduced power is generated by operating the main amplifier without the peaking amplifier, while maintaining an efficiency similar to an efficiency when the main amplifier and the peaking amplifier are both operated, wherein maintaining an efficiency similar to an efficiency when the main amplifier and the peaking amplifier are both operated comprises continuously flowing a current in the primary side of the transformer.

18. The method of claim 16, wherein:
the main amplifier and the peaking amplifier have the same operating characteristics.

19. The method of claim 16, wherein:
the main amplifier and the peaking amplifier have different operating characteristics.

20. The method of claim 17, wherein maintaining an efficiency similar to an efficiency when the main amplifier and the peaking amplifier are both operated comprises continuously flowing a current in the primary side of the transformer.

21. The method of claim 16, wherein:
the maximum power is generated by operating the main amplifier and a plurality of peaking amplifiers; and
the reduced power is generated by operating the main amplifier while successively turning off peaking amplifiers of the plurality of peaking amplifiers.

22. The method of claim 16, wherein without the peaking amplifier a loss of the main amplifier is reduced and an efficiency of the main amplifier at backoff power is improved as compared to operating the amplifier to achieve the backoff power without turning off any peaking amplifiers.

23. An amplifier, comprising:
a transformer;
means for amplifying a communication signal using at least one main amplifier having a first main portion and a second main portion, and at least one peaking amplifier having a first peaking portion and a second peaking portion to generate a maximum power;
means for causing an impedance increase at a primary side of the transformer at a reduced power; and
means for amplifying the communication signal to generate the reduced power while maintaining a power efficiency within a range of 3 dB.

24. The amplifier of claim 23, wherein the means for amplifying the communication signal to generate the reduced power comprises means for maintaining an impedance transformation ratio at backoff power.

25. An amplifier, comprising:
a plurality of main amplifier portions;
a plurality of peaking amplifier portions;
a transformer having a primary side and a secondary side, the primary side having a plurality of primary segments; and
a plurality of transformer loops, each transformer loop formed by a respective main amplifier portion of the plurality of main amplifier portions, one or more respective peaking amplifier portions of the plurality of peaking amplifier portions, and two or more respective segments of the plurality of primary segments.

26. The amplifier of claim 25, wherein:
the plurality of main amplifier portions comprises a first main portion and a second main portion, the first main portion and the second main portion having the same operating characteristics; and
the plurality of peaking amplifier portions comprises a first peaking portion and a second peaking portion, the first peaking portion and the second peaking portion having the same operating characteristics.

27. The amplifier of claim 25, wherein:
the plurality of main amplifier portions comprises a first main portion and a second main portion, the first main portion and the second main portion having different operating characteristics; and the plurality of peaking amplifier portions comprises a first peaking portion and a second peaking portion, the first peaking portion and the second peaking portion having different operating characteristics.

28. The amplifier of claim 25, wherein:

the plurality of transformer loops are concentric.

29. The amplifier of claim 25, wherein at least one of the plurality of peaking amplifier portions is configured to turn off to generate a backoff power.

30. The amplifier of claim 25, wherein at least two of the plurality of transformer loops cross.

* * * * *